United States Patent
Zhong et al.

(10) Patent No.: US 6,268,251 B1
(45) Date of Patent: Jul. 31, 2001

(54) METHOD OF FORMING MOS/CMOS DEVICES WITH DUAL OR TRIPLE GATE OXIDE

(75) Inventors: Dong Zhong; Jia Zhen Zheng, both of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/614,556

(22) Filed: Jul. 12, 2000

(51) Int. Cl.$^7$ .............................................. H01L 21/8234
(52) U.S. Cl. ........................................ 438/275; 438/981
(58) Field of Search ...................... 438/199, 275, 438/279, 626, 633, 981

(56) References Cited

U.S. PATENT DOCUMENTS

| | | | |
|---|---|---|---|
| 5,432,114 | * 7/1995 | O .......................................... | 438/275 |
| 5,595,922 | * 1/1997 | Tigelaar et al. ....................... | 438/981 |
| 5,926,708 | * 7/1999 | Martin .................................. | 438/275 |
| 5,926,729 | * 7/1999 | Tsai et al. ............................. | 438/981 |
| 5,953,599 | * 9/1999 | El-Diwany ............................ | 438/275 |
| 5,970,345 | * 10/1999 | Hattangady et al. ................. | 438/981 |

FOREIGN PATENT DOCUMENTS 2-237037 * 9/1990 (JP) .

* cited by examiner

*Primary Examiner*—Chandra Chaudhari
(74) *Attorney, Agent, or Firm*—George O. Saile; Rosemary L. S. Pike; William J. Stuffel

(57) ABSTRACT

A method of fabricating multiple thickness gate oxide layers, comprising the following steps. A silicon substrate having at least a first and second gate oxide region is provided. A first gate oxide layer is formed over the silicon substrate within the first gate oxide region. The first gate oxide layer having a first predetermined thickness. A first layer of polysilicon is deposited and planarized over the first gate oxide layer. The first planarized layer of polysilicon and the first gate oxide layer are masked and etched within the second gate oxide region, exposing the silicon substrate within the second gate oxide region. A second gate oxide layer is formed over the exposed silicon substrate within the second gate oxide region. The second gate oxide layer having a second predetermined thickness. A second layer of polysilicon is selectively deposited over the second gate oxide layer. The first and second layers of polysilicon are planarized to a uniform thickness. Whereby the second gate oxide layer predetermined thickness is less than the first gate oxide layer predetermined thickness.

24 Claims, 6 Drawing Sheets

US 6,268,251 B1

METHOD OF FORMING MOS/CMOS DEVICES WITH DUAL OR TRIPLE GATE OXIDE

FIELD OF THE INVENTION

The present invention relates generally to methods of forming semiconductor devices and specifically to methods of forming metal-oxide-semiconductor (MOS) and complimentary-metal-oxide-semiconductor (CMOS) devices with varying thicknesses of gate oxides.

BACKGROUND OF THE INVENTION

Thick gate oxide quality is adversely affected when another, thinner gate oxide is formed from a portion of the thick oxide by partially removing that portion of the thick gate oxide and by a subsequent cleaning process. Additionally, thick gate oxide integrity (GOI) failure will occur.

Further, there is not available a reliable method of forming triple gate oxides, each with a different thickness, in MOS/CMOS devices on the same wafer.

A method of forming such triple, or greater, gate oxides on the same wafer will have potential application when device dimensions, or design rule, becomes smaller and smaller which may well require different operating voltages for the input and output of transistors. The lower the voltage, the thinner the gate oxide. The gate oxide of a lower voltage device, i.e. having a thinner gate oxide, cannot withstand the higher voltage of an older technology device and will wear out, or fail, too quickly.

U.S. Pat. No. 5,926,708 to Martin describes a method of manufacturing an integrated circuit with two or more gate oxide thicknesses on the same wafer. A first gate oxide layer is formed on a semiconductor wafer. A first layer of polysilicon is formed over the first gate oxide layer and a polish stop film is formed over the first polysilicon layer. The polish stop and first poly layer are etched to expose a portion of the first gate oxide layer. The exposed first gate layer portion is stripped to expose a portion of the underlying wafer. A second gate oxide layer, thicker than the first gate oxide layer, is then formed on the exposed wafer portion and a gate conductor material layer is formed over the second gate oxide layer, blanket covering the first poly layer. The gate conductor layer is planarized by CMP to remove it form the first poly layer, forming a gate conductor.

U.S. Pat. No. 5,953,599 to El-Diwany describes a method of forming a thin layer of gate oxide for low-voltage transistors that support the logic operations of a CMOS device, and a thick layer of gate oxide for high-voltage transistors that support the analog operations of the device.

U.S. Pat. No. 5,432,114 to O describes a method of fabricating an IGFET integrated circuit (IC) having two gate dielectric layers with different parameters. The O process is typically used for fabrication of dual voltage CMOS integrated circuits. The IC may include high voltage transistors having a first gate dielectric thickness and low voltage transistors having a second gate dielectric thickness.

SUMMARY OF THE INVENTION

Accordingly, it is an object of the present invention to provide a method of forming MOS/CMOS devices having dual, i.e. both thick and thin, quality gate oxides.

Another object of the present invention is to provide a method of forming MOS/CMOS devices having dual, i.e. both thick and thin, quality gate oxides while maintaining gate oxide integrity (GOI).

A further object of the present invention is to provide a method of forming MOS/CMOS devices having triple, i.e. thick, intermediate, and thin, quality gate oxides.

Yet another object of the present invention is to provide a method of forming MOS/CMOS devices having triple, i.e. thick, intermediate, and thin, quality gate oxides while minimizing the gate oxide integrity (GOI) issue.

Other objects will appear hereinafter.

It has now been discovered that the above and other objects of the present invention may be accomplished in the following manner. Specifically, a silicon substrate having at least a first and second gate oxide region is provided. A first gate oxide layer is formed over the silicon substrate within the first gate oxide region. The first gate oxide layer having a first predetermined thickness. A first layer of polysilicon is deposited and planarized over the first gate oxide layer. The first planarized layer of polysilicon and the first gate oxide layer are masked and etched within the second gate oxide region, exposing the silicon substrate within the second gate oxide region. A second gate oxide layer is formed over the exposed silicon substrate within the second gate oxide region. The second gate oxide layer having a second predetermined thickness. A second layer of polysilicon is selectively deposited over the second gate oxide layer. The first and second layers of polysilicon are planarized to a uniform thickness. Whereby the second gate oxide layer predetermined thickness is less than the first gate oxide layer predetermined thickness.

BRIEF DESCRIPTION OF THE DRAWINGS

The features and advantages of the method the present invention will be more clearly understood from the following description taken in conjunction with the accompanying drawings in which like reference numerals designate similar or corresponding elements, regions and portions and in which:

FIGS. 1 through 4, and 7 through 12 schematically illustrate in cross-sectional representation an alternate embodiment of the present invention.

DETAILED DESCRIPTION OF THE PREFERRED EMBODIMENT

Figure 1:
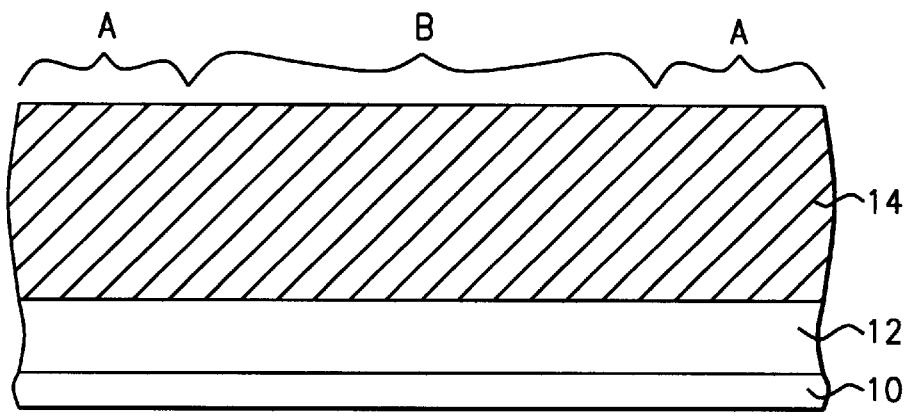
FIGS. 1 through 4, and 5 through 6 schematically illustrate in cross-sectional representation an embodiment of the present invention.

Accordingly as shown in FIG. 1, starting semiconductor substrate 10 preferably includes a upper layer of silicon and is understood to possibly include a semiconductor wafer. Unless otherwise specified, all structures, layers, etc. may be formed or accomplished by conventional methods known in the prior art.

First Embodiment—Dual Gate Oxides

In the first embodiment of the present invention, dual gate oxide layers 12 and 18 are formed as illustrated in FIGS. 1–6.

As shown in FIG. 1, semiconductor substrate 10 includes first gate oxide regions "A" and second gate oxide region "B." Although two first gate oxide regions A and a single second gate oxide region B are illustrated in FIG. 1 et al., other combinations are permissible such a single first gate oxide region A and two second gate oxide regions B, etc.

First gate oxide regions A are from about 1500 to 15,000 Å wide and more preferably from about 2500 to 5000 Å wide. Second gate oxide region B is from about 800 to 3500 Å wide and more preferably from about 1000 to 2500 Å wide.

A first layer of gate oxide 12 is formed over semiconductor substrate 10. First gate oxide layer 12 is preferably formed by a thermal oxidation process. First gate oxide layer is from about 50 to 150 thick, more preferably from about 60 to 90 Å thick, and most preferably from about 65 to 80 Å thick.

A first layer of polysilicon 14 is then formed and planarized over first gate oxide layer 12. Planarized first polysilicon layer 14 is from about 1500 to 3500 Å thick, and is more preferably from about 2000 to 3000 Å thick.

Figure 2:
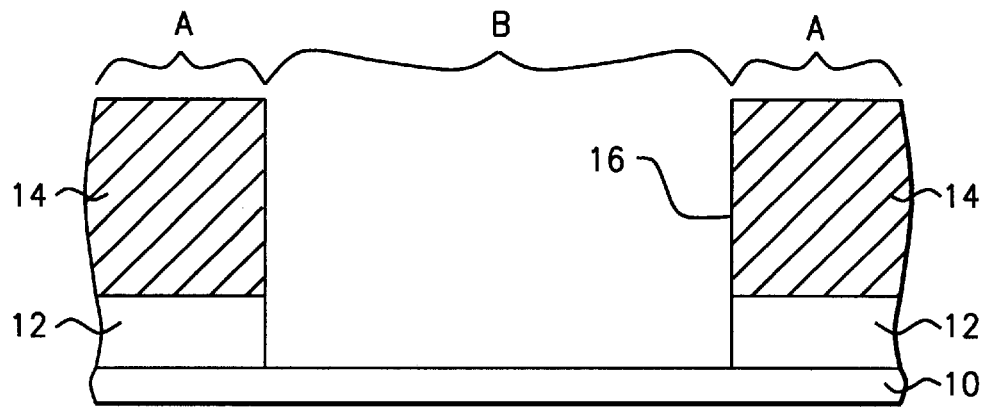

As shown in FIG. 2, first polysilicon layer 14 and first gate oxide layer 12 are masked and etched to form opening 16, exposing semiconductor substrate 10 within second gate oxide region B. First polysilicon layer 14 and first gate oxide layer 12 may, although not necessarily, be divided into separate portions as shown in FIG. 2 by this etching. The width of opening 16 corresponds to the width of second gate oxide region B.

The structure may then be cleaned.

Figure 3:
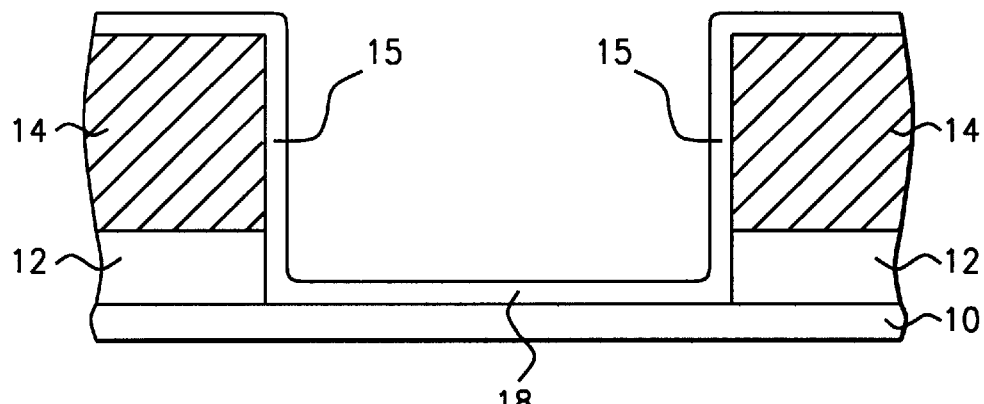

As shown in FIG. 3, second gate oxide layer 18 is formed over the exposed semiconductor substrate 10 within opening 16. Second gate oxide layer 18 is preferably formed by a thermal oxidation process and is formed by a CVD process if a high-k dielectric material is used. Growth of second gate oxide layer 18 over exposed semiconductor substrate 10 also causes growth of first polyoxide layer 15 over the exposed surface of etched first polysilicon layer 14.

Figure 13:
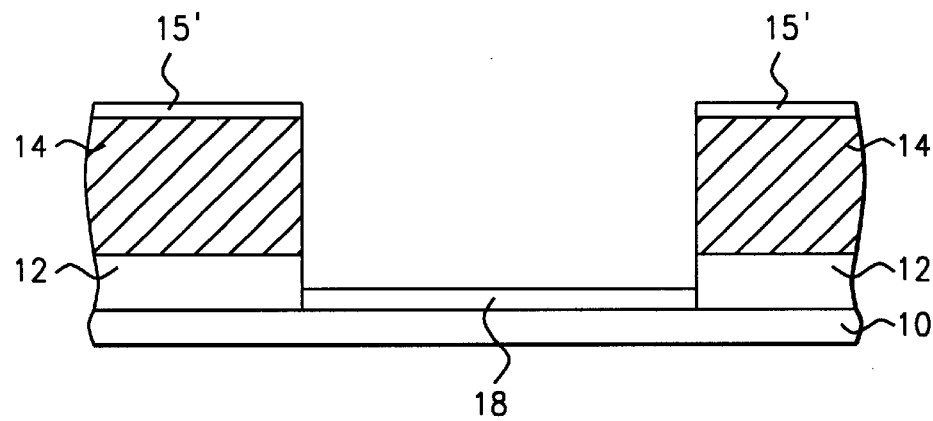
FIGS. 13 and 14 schematically illustrate in cross-sectional representation an option of the first embodiment.
Figure 14:
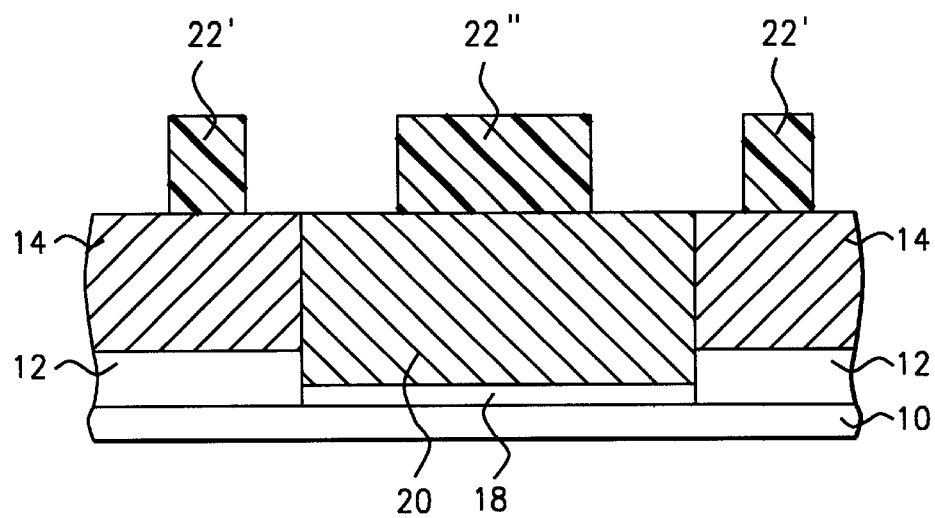

In an option of the first embodiment, FIG. 13 illustrates second gate oxide layer 18 being formed by an anisotropic deposition. An anisotropic deposition is a process wherein deposition is only on the horizontal surfaces and not the vertical surfaces. The anisotropic deposition may be formed by any available method such as a CVD process. The anisotropic deposition of gate oxide layer 18 over exposed semiconductor substrate 10 also causes growth of first polyoxide layer 15' over only the horizontal exposed surface of etched first polysilicon layer 14. This will permit elimination of any possible oxide fences as shown in FIG. 14 (analogous to FIG. 5).

Second gate oxide layer 18 is from about 20 to 80 Å thick, more preferably from about 25 to 60 Å thick, and is most preferably from about 30 to 50 A thick. It is critical that second gate oxide layer 18 is thinner than first gate oxide layer 12. The thickness of first polyoxide layer 15 is essentially the same as the thickness of second gate oxide layer 18.

Figure 4:
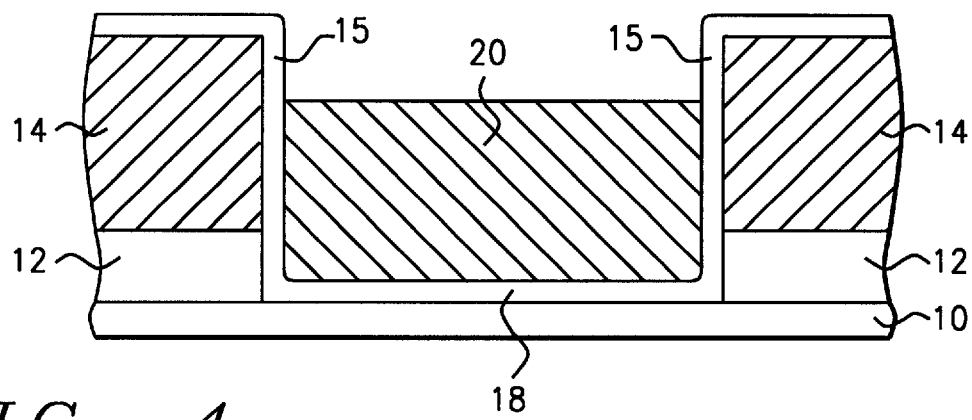

As shown in FIG. 4, second polysilicon layer 20 is then formed over second gate oxide layer 18 and extends above the remaining portions of first gate oxide layer 12. Second polysilicon layer 20 is preferably formed by a CVD process.

Second polysilicon layer 20 is from about 1200 to 3000 Å thick, and is more preferably from about 1800 to 2800 Å thick.

Figure 5:
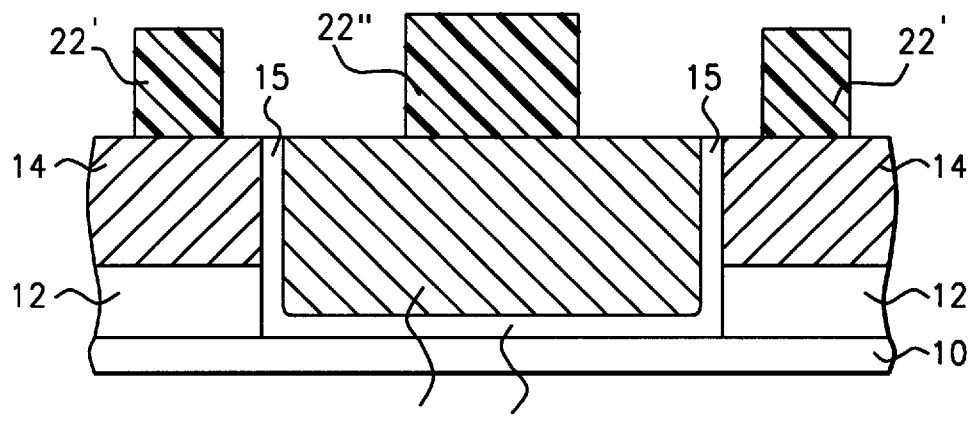

As shown in FIG. 5, first polysilicon layer portions 14 and second polysilicon layer 20 are polished, or planarized, to form a planar upper surface. Planarized first polysilicon layer portions 14 and second polysilicon layer 20 preferably extend over first gate oxide layer portions 12.

This polishing or planarizing may be accomplished by chemical-mechanical polishing and also removes the horizontal portions of first polyoxide layer 15 and the vertical portions of first polyoxide layer 15 down to the upper surface of planarized first polysilicon layer portions 14 and second polysilicon layer 20 as shown in FIG. 5.

A first layer of photoresist is then formed and patterned to form photoresist masks 22' and 22" over planarized first polysilicon layer portions 14 and second polysilicon layer 20, respectively.

Figure 6:
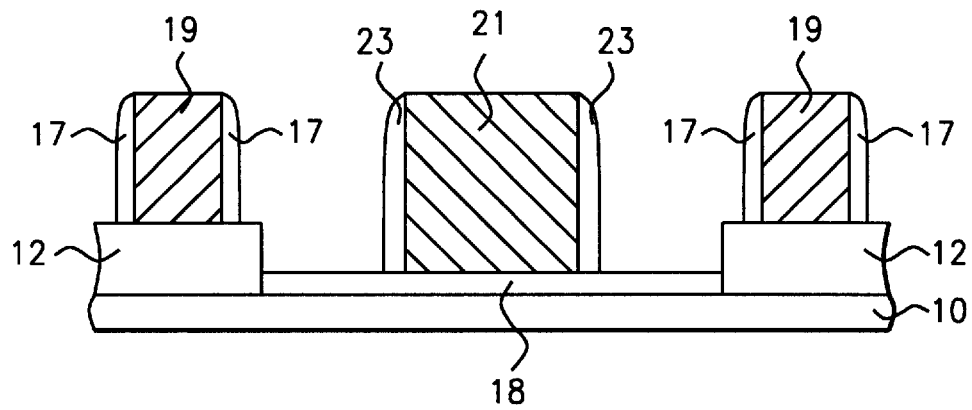

As shown in FIG. 6, first polysilicon layer portions 14 and second polysilicon layer 20 are etched to form first gate electrodes 19 over first gate oxide layer portions 12 and second gate electrode 21 over second gate oxide layer 18, respectively. This removes the remaining vertical portions of first polyoxide layer 15 and leaves only the planar portions of first and second gate oxide layers 12 and 18.

Photoresist masks 22', 22" are removed and sidewall spacers 17 and 23 may be formed adjacent first gate electrodes 19 and second gate electrode 21 as shown in FIG. 6.

Although not shown, adjacent first gate oxide layer portions 12 and second gate oxide layer 18 may be isolated from each other by, for example, a shallow trench isolation (STI) technique.

High voltage, e.g. 3.3 or 5 volt, transistors would include thicker first gate oxide layers 12, while a low voltage, e.g. 2.5 volt, transistor would include thinner second gate oxide layer 18. Such high operating voltage transistors may support analog operations of a MOS/CMOS device while such a low operating voltage transistor may support logic operations of the device.

Second Embodiment—Triple Gate Oxides

Figure 7:
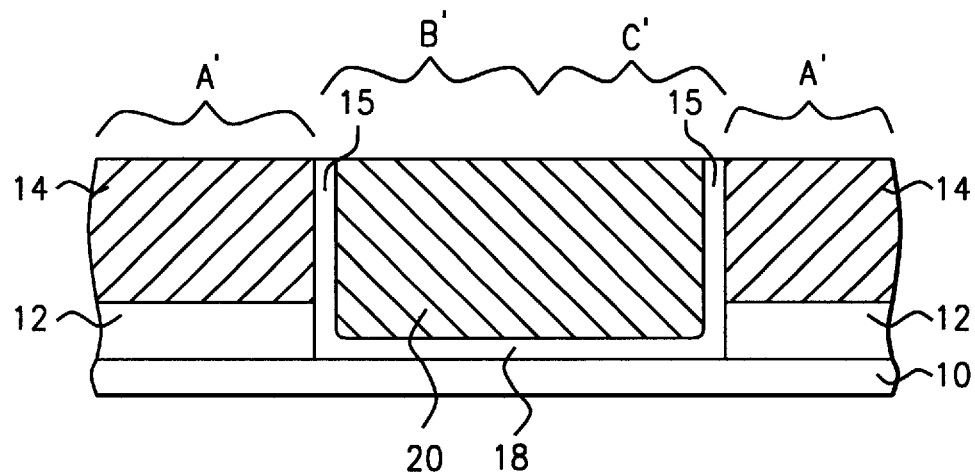

In the second embodiment of the present invention, the processing of FIGS. 1 through 4 is continued in FIGS. 7 through 12 to form triple gate oxide layers, i.e. first gate oxide layer portions 12, second gate oxide layer 18, and third gate oxide layer 26. As shown in FIG. 7, in the second embodiment, semiconductor substrate 10 includes first gate oxide regions "A'" and second gate oxide region "B'", and third gate oxide region "C'."

First gate oxide regions A' are from about 1500 to 15,000 Å wide, and more preferably from about 2500 to 5000 Å wide. Second gate oxide region B' is from about 800 to 3500 Å wide, and more preferably from about 1000 to 2500 Å wide. Third gate oxide region C' is from about 500 to 2500 Å wide, and more preferably from about 800 to 1500 Å wide.

First gate oxide layer is from about 50 to 150 Å thick, more preferably from about 60 to 90 Å thick, and most preferably from about 65 to 80 Å thick. Second gate oxide layer 18 is from about 20 to 80 Å thick, more preferably from about 25 to 60 Å thick, and is most preferably from about 30 to 50 Å thick.

Although two first gate oxide regions A', a single second gate oxide region B', and a single gate oxide region C' are illustrated in FIG. 7 et al., other combinations are permissible such a single first gate oxide region A', two second gate oxide regions B', and two third gate oxide regions C', etc.

As shown in FIG. 7, first polysilicon layer portions 14 and second polysilicon layer 20 of FIG. 4 are polished, or planarized, to form a planar upper surface. Planarized first polysilicon layer portions 14 and second polysilicon layer preferably extend over first gate oxide layer portions 12.

This polishing or planarizing may be accomplished by chemicalmechanical polishing and completely removes the horizontal portions of first polyoxide layer 15 and the vertical portions of first polyoxide layer 15 down to the upper surface of planarized first polysilicon layer portions 14 and second polysilicon layer 20 as shown in FIG. 7.

Figure 8:
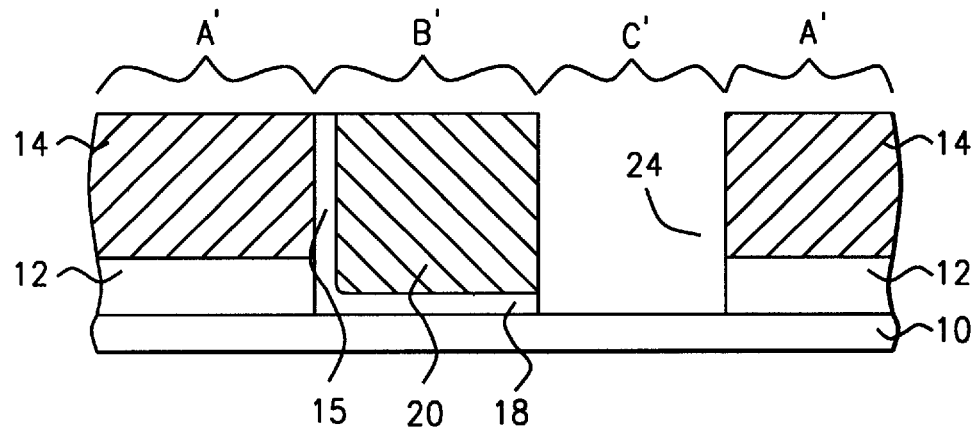

As shown in FIG. 8, the portions of planarized polysilicon layer 20 and second gate oxide layer 18 within third gate oxide region C' are masked and etched to form opening 24, exposing semiconductor substrate 10 within third gate oxide region C'. The width of opening 24 corresponds to the width of third gate oxide region C'.

The structure may then be cleaned.

Figure 9:
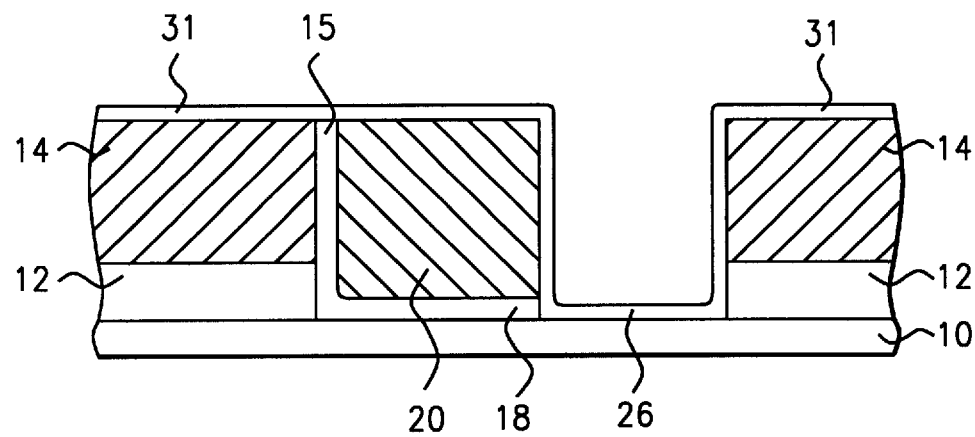

As shown in FIG. 9, third gate oxide layer 26 is formed over the exposed semiconductor substrate 10 within opening 24. Third gate oxide layer 26 is preferably formed by a thermal oxidation process and is formed by a CVD process if a high-k dielectric material is used. Growth of third gate oxide layer 26 over exposed semiconductor substrate 10 also causes growth of second polyoxide layer 31 over the exposed surface of etched first polysilicon layer 14 and second polysilicon layer 20.

Figure 15:
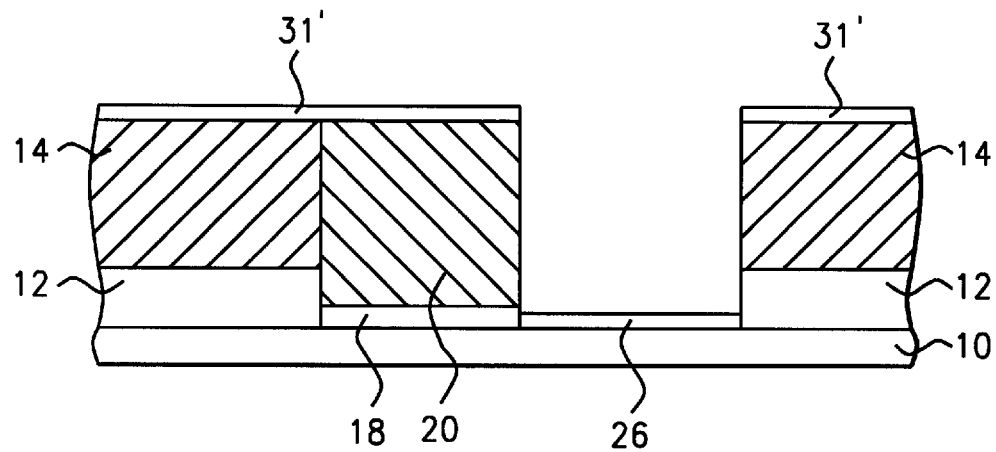
FIGS. 15 and 16 schematically illustrate in cross-sectional representation an option of the alternate embodiment.
Figure 16:
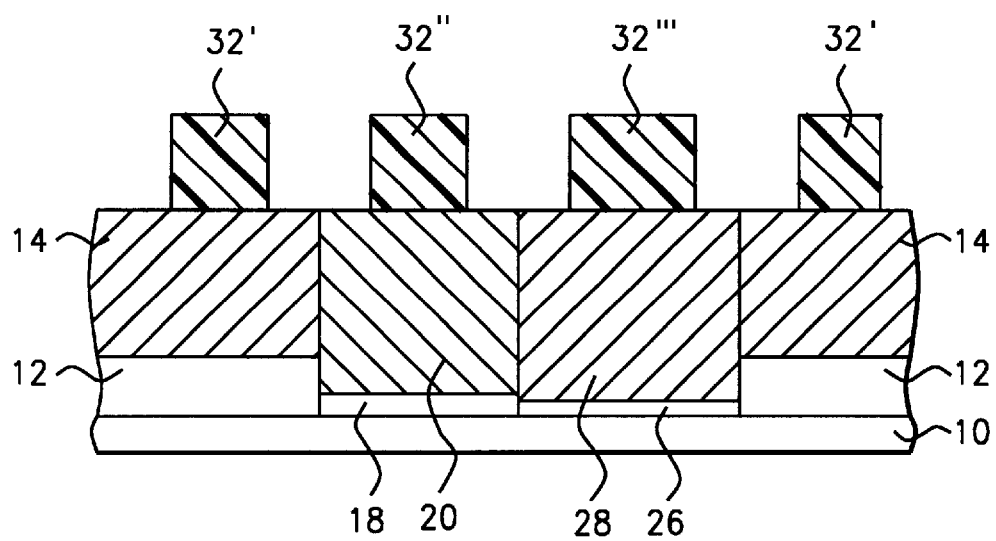

In an option of the alternative embodiment, FIG. 15 illustrates third gate oxide layer 26 being formed by an anisotropic deposition process. An anisotropic deposition is a process wherein deposition is only on the horizontal surfaces and not the vertical surfaces. The anisotropic deposition may be formed by any available method such as a CVD process. The anisotropic deposition of gate oxide layer 26 over exposed semiconductor substrate 10 also causes growth of second polyoxide layer 31' over only the horizontal exposed surface of etched first polysilicon layer 14 and second polysilicon layer 20. This will permit elimination of any possible oxide fences as shown in FIG. 16 (analogous to FIG. 11).

Third gate oxide layer 26 is from about 10 to 30 Å thick, and is more preferably from about 15 to 25 Å thick. It is critical that third gate oxide layer 26 is thinner than second gate oxide layer 18. The thickness of second polyoxide layer 31 is essentially the same as the thickness of third gate oxide layer 26.

Figure 10:
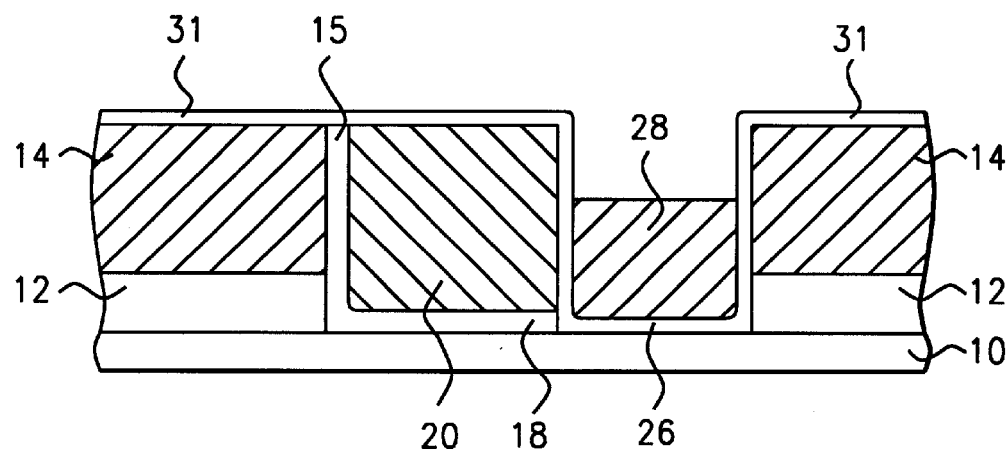

As shown in FIG. 10, third polysilicon layer 28 is then formed over third gate oxide layer 26 and extends above first gate oxide layer portions 12. Third polysilicon layer 28 is preferably formed by a CVD process.

Third polysilicon layer 28 is from about 1000 to 2500 Å thick, and is more preferably from about 1500 to 2500 Å thick.

Figure 11:
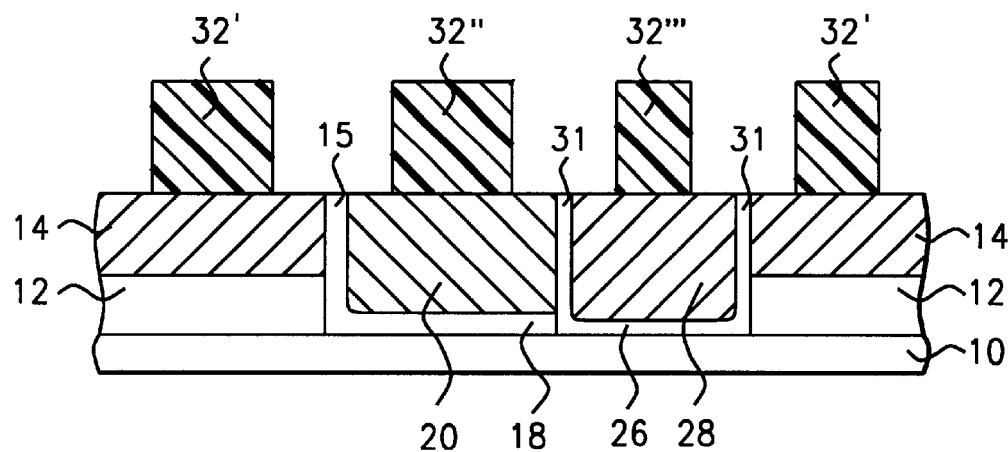

As shown in FIG. 11, previously planarized first polysilicon layer portions 14 and second polysilicon layer 20, and third polysilicon layer 28, are polished, or planarized, to form a planar upper surface. Planarized first, second and third polysilicon layers 14, 20, and 28, respectively, preferably extend over first gate oxide layer portions 12.

This polishing or planarizing may be accomplished by chemical-mechanical polishing and also removes the horizontal portions of second polyoxide layer 31, and the vertical portions of remaining first polyoxide layer 15 and second polyoxide layer 31, down to the upper surface of planarized first polysilicon layer portions 14, second polysilicon layer 20, and third polysilicon layer 28 as shown in FIG. 11.

A second layer of photoresist is then formed and patterned to form second photoresist masks 32', 32", and 32'" over planarized first polysilicon layer portions 14, second polysilicon layer 20, and third polysilicon layer 28, respectively.

Figure 12:
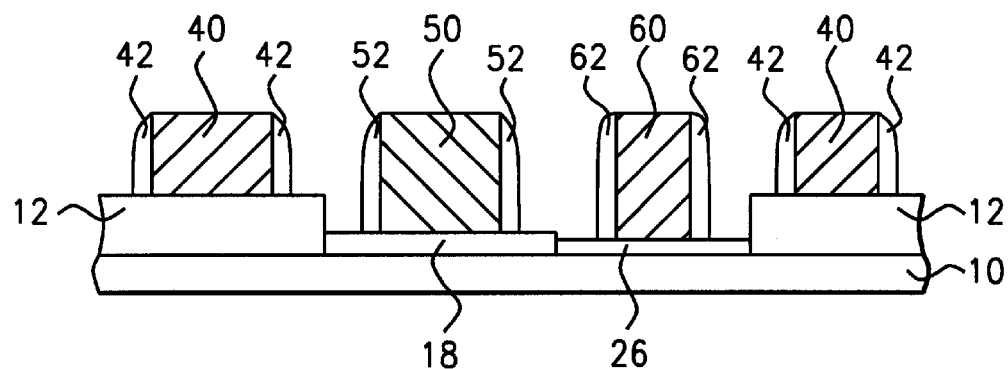

As shown in FIG. 12, first polysilicon layer portions 14, second polysilicon layer 20, and third polysilicon layer 28 are etched to form first gate electrodes 40 over first gate oxide layer portions 12, and second gate electrode 50 over second gate oxide layer 18, and third gate electrode 60 over third gate oxide layer 26, respectively. This removes the remaining vertical portions of both first polyoxide layer 15 and second polyoxide layer 31, and leaves only the planar portions of first, second, and third gate oxide layers 12, 18 and 26.

Photoresist masks 32', 32", 32'" are removed and sidewall spacers 42, 52 and 62 may be formed adjacent first, second, and third gate electrodes 40, 50 and 60 as shown in FIG. 12.

Although not shown, first, second and third gate oxide layer portions 12, 18, and 26 may be isolated from one other by, for example, a shallow trench isolation (STI) technique.

High voltage transistors would include the thicker first gate oxide layers 12; a low voltage transistor would include the thin third gate oxide layer 26; while an intermediate voltage transistor would include the medium thickness second gate oxide layer portion 18'. The second embodiment is utilized as the device dimension becomes smaller and smaller, which may require different operating voltages for input and output.

ADVANTAGES OF THE PRESENT INVENTION

In any event, the gate oxide quality of first gate oxide layers 12 and second gate oxide 18 of the first embodiment, and first gate oxide layers 12, second gate oxide portion 18, and third gate oxide 26 of the second embodiment is maintained. Further, the gate oxide integrity (GOI) issue will be minimized.

The present invention, whether the first or second embodiments, forms the thicker gate oxide layers utilized by the older technology devices followed by the intermediate and/or thinner gate oxide layers utilized by the latest technology, or even future technology with the thinner gate oxide layers.

Also, the first 14, second 20 and third 28 polysilicon layers vary in thickness. In the first embodiment, first polysilicon layers 14 thicker is than second polysilicon layer 20. Further, in the second embodiment, second polysilicon layer 20 is thicker than third polysilicon layer 28.

The first purpose for this sequence is that oxidation on first polysilicon layer portions 14 during growth of second gate oxide layer 18 will consume first polysilicon layer portions 14 (see FIG. 3); and, in the second embodiment, oxidation on the first and second polysilicon layers 14, 20, respectively, during growth of third gate oxide layer 26 will consume first polysilicon layer portions 14 and second polysilicon layer portion 20 (see FIG. 9).

The second purpose for this sequence is that, in the first embodiment, slight over-polish of polysilicon layer portions 14 on top of the first gate oxide portions 12 is necessary to remove first polysilicon oxide (polyoxide) layer 15 completely such that both polysilicon layer portions 14 and 20,respectively, require a thicker polysilicon layer. Further, in the second embodiment, slight over-polish of first polysilicon layer portions 14 on top of first gate oxide portions 12, and of second polysilicon layer 20 on top of second gate oxide 18, is necessary to remove second polysilicon oxide (polyoxide) layer 31 completely such that first, second, and third polysilicon layer portions 14, 20 and 28, respectively, require a thicker polysilicon layer.

Further, dishing is minimized or eliminated since the area of the thicker first gate oxide portions 12 in the first embodiment, and first v. second v. third gate oxide portions 12, 18, 26 in the second embodiment, is less than that of the thinner second gate oxide 18 in the first embodiment, and second gate oxide 18 v. third gate oxide 26 in the second embodiment, because the area of polysilicon to be polished is small.

Oxide fences are minimized because polysilicon oxidation will be less if thinner gate oxides are formed. It is possible to eliminate oxide fences by forming gate oxide layers 18; 18, 26 only on the horizontal surfaces (of semiconductor substrate 10 and poly layer 14; or first poly layer 14 and second poly layer 20, respectively) if, for example, gate oxide layers 18; 18, 26 are formed of a high-k dielectric material deposited by an anisotropic deposition (such as a CVD process) as noted above.

While particular embodiments of the present invention have been illustrated and described, it is not intended to limit the invention, except as defined by the following claims.

We claim:

1. A method of fabricating multiple thickness gate oxide layers, comprising the steps of:
    providing a silicon substrate having at least a first and second gate oxide region;
    forming a first gate oxide layer over said silicon substrate; said first gate oxide layer having a first predetermined thickness;
    forming and planarizing a first layer of polysilicon over said first gate oxide layer;
    etching said first planarized layer of polysilicon and said first gate oxide layer within said second gate oxide region exposing the silicon substrate within said second gate oxide region and leaving said first layer of polysilicon within said first gate oxide region
    forming a second gate oxide layer over said exposed silicon substrate within said second gate oxide region; said second gate oxide layer having a second predetermined thickness; said second gate oxide layer predetermined thickness being less than said first gate oxide layer predetermined thickness
    forming a second layer of polysilicon over said second gate oxide layer;
    planarizing said first and second layers of polysilicon to a uniform thickness.

2. The method of claim 1, wherein said second gate oxide is formed by an anisotropic deposition whereby said second gate oxide layer is formed only upon exposed horizontal surfaces.

3. The method of claim 1, wherein said first predetermined thickness of said first gate oxide layer is from about 60 to 90 Å, and said second predetermined thickness of said second gate oxide layer is from about 25 to 60 Å.

4. The method of claim 1, wherein said first predetermined thickness of said first gate oxide layer is from about 65 to 80 Å, and said second predetermined thickness of said second gate oxide layer is from about 30 to 50 Å.

5. The method of claim 1, wherein said first gate oxide region is from about 1500 to 15,000 Å wide and said second gate oxide region is from about 800 to 3500 Å wide.

6. The method of claim 1, wherein said first gate oxide region is from about 2500 to 5000 Å wide and said second gate oxide region is from about 1000 to 2500 Å wide.

7. The method of claim 1, wherein said first planarized layer of polysilicon is from about 1500 to 3500 Å thick, said second layer of polysilicon is from about 1200 to 3000 Å thick, and said uniform thickness of said first and second planarized layer of polysilicon is from about 1500 to 2500 Å thick.

8. The method of claim 1, wherein said first planarized layer of polysilicon is from about 2000 to 3000 Å thick, said second layer of polysilicon is from about 1800 to 2800 Å thick, and said uniform thickness of said first and second planarized layer of polysilicon is from about 1500 to 2500 Å.

9. The method of claim 1, including the steps of:
    removing said first and second planarized layer of polysilicon from at least said first and second gate oxide layers;
    forming a first gate conductor on said first gate oxide layer; and
    forming a second gate conductor on said second gate oxide layer.

10. The method of claim 1, including the steps of:
    removing said first and second planarized layer of polysilicon from at least said first and second gate oxide layers;
    forming a first gate conductor on said first gate oxide layer; and
    forming a second gate conductor on said second gate oxide layer;
    wherein said first gate conductor forms a part of a first transistor having a first operating voltage, and said second gate conductor forms a part of a second transistor having a second operating voltage, and said first operating voltage is greater than said second operating voltage.

11. The method of claim 1, wherein said silicon substrate has a third gate oxide region and including the steps of:
    etching said uniformly thick first and second planarized layer of polysilicon within said third gate oxide region exposing the silicon substrate within said third gate oxide region;
    forming a third gate oxide layer over said exposed silicon substrate within said third gate oxide region; said third gate oxide layer having a third predetermined thickness; said third gate oxide layer predetermined thickness is less than said second gate oxide layer predetermined thickness;
    forming a third layer of polysilicon over said third gate oxide layer; and
    planarizing said first, second, and third layers of polysilicon to a uniform thickness.

12. The method of claim 1, wherein said silicon substrate has a third gate oxide region and including the steps of:
    etching said uniformly thick first and second planarized layer of polysilicon within said third gate oxide region exposing the silicon substrate within said third gate oxide region;
    forming a third gate oxide layer over said exposed silicon substrate within said third gate oxide region; said third gate oxide layer having a third predetermined thickness; said third gate oxide layer predetermined thickness is less than said second gate oxide layer predetermined thickness;
    forming a third layer of polysilicon over said third gate oxide layer;
    planarizing said first, second, and third layers of polysilicon to a uniform thickness; and
    wherein said first predetermined thickness of said first gate oxide layer is from about 50 to 150 Å, said second predetermined thickness of said second gate oxide layer is from about 20 to 80 Å, and said third predetermined thickness of said third gate oxide layer is from about 10 to 30 Å.

13. The method of claim 1, wherein said silicon substrate has a third gate oxide region and including the steps of:
    etching said uniformly thick first and second planarized layer of polysilicon within said third gate oxide region exposing the silicon substrate within said third gate oxide region;
    forming a third gate oxide layer over said exposed silicon substrate within said third gate oxide region; said third gate oxide layer having a third predetermined thickness; said third gate oxide layer predetermined thickness is less than said second gate oxide layer predetermined thickness;

forming a third layer of polysilicon over said third gate oxide layer;

planarizing said first, second, and third layers of polysilicon to a uniform thickness; and wherein said first gate oxide region is from about 1500 to 15,000 Å wide, said second gate oxide region is from about 800 to 3500 Å wide, and said third gate oxide region is from about 500 to 2500 Å wide.

14. A method of fabricating gate oxide layers, comprising the steps of:

providing a silicon substrate having a first, second and third gate oxide regions;

forming a first gate oxide layer over said silicon substrate; said first gate oxide layer having a first predetermined thickness;

forming and planarizing a first layer of polysilicon over said first gate oxide layer;

etching said first planarized layer of polysilicon and said first gate oxide layer within said second gate oxide region exposing the silicon substrate within said second gate oxide region;

forming a second gate oxide layer over said exposed silicon substrate within said second gate oxide region; said second gate oxide layer having a second predetermined thickness; said second gate oxide layer thickness being less than said first gate oxide layer thickness;

forming a second layer of polysilicon over said second gate oxide layer;

planarizing said first and second layers of polysilicon to a uniform thickness;

etching said second planarized layer of polysilicon and said second gate oxide layer within said third gate oxide region exposing the silicon substrate within said third gate oxide region;

forming a third gate oxide layer over said exposed silicon substrate within said third gate oxide region; said third gate oxide layer having a third predetermined thickness; said third gate oxide layer thickness being less than said second gate oxide layer thickness;

forming a third layer of polysilicon over said third gate oxide layer; and planarizing said first, second and third layers of polysilicon to a uniform thickness.

15. The method of claim 14, wherein said first predetermined thickness of said first gate oxide layer is from about 50 to 150 Å, said second predetermined thickness of said second gate oxide layer is from about 20 to 80 Å, and said third predetermined thickness of said third gate oxide layer is from about 10 to 30 Å.

16. The method of claim 14, wherein said second and third gate oxide layers are formed by an anisotropic deposition, respectively, whereby said second and third gate oxide layers are formed only upon exposed horizontal surfaces, respectively.

17. The method of claim 14, wherein said first predetermined thickness of said first gate oxide layer is from about 65 to 80 Å, said second predetermined thickness of said second gate oxide layer is from about 30 to 50 Å, and said third predetermined thickness of said third gate oxide layer is from about 15 to 25 Å.

18. The method of claim 14, wherein said first gate oxide region is from about 1500 to 15,000 Å wide, said second gate oxide region is from about 800 to 3500 Å wide, and said third gate oxide region is from about 500 to 2500 Å wide.

19. The method of claim 14, wherein said first gate oxide region is from about 2500 to 5000 Å wide, said second gate oxide region is from about 1000 to 2500 Å wide, and said third gate oxide region is from about 800 to 1500 Å wide.

20. The method of claim 14, wherein said first planarized layer of polysilicon is from about 1500 to 3500 Å thick, said second layer of polysilicon is from about 1200 to 3000 Å thick, said uniform thickness of said first and second planarized layer of polysilicon is from about 1500 to 2500 Å thick, said third layer of polysilicon is from about 1500 to 2500 Å thick, and said uniform thickness of said first, second, and third planarized layer of polysilicon is from about 1500 to 2500 Å thick.

21. The method of claim 14, wherein said first planarized layer of polysilicon is from about 2000 to 3000 Å thick, said second layer of polysilicon is from about 1800 to 2500 Å thick, said uniform thickness of said first and second planarized layer of polysilicon is from about 1500 to 2500 Å, said third layer of polysilicon is from about 1500 to 2500 Å thick, and said uniform thickness of said first, second, and third planarized layer of polysilicon is from about 1500 to 2500 Å thick.

22. The method of claim 14, including the steps of:

removing said first, second, and third planarized layer of polysilicon from at least said first, second, and third gate oxide layers;

forming a first gate conductor on said first gate oxide layer;

forming a second gate conductor on said second gate oxide layer, and forming a third gate conductor on said third gate oxide layer.

23. The method of claim 14, including the steps of:

removing said first, second, and third planarized layer of polysilicon from at least said first, second, and third gate oxide layers;

forming a first gate conductor on said first gate oxide layer;

forming a second gate conductor on said second gate oxide layer, forming a third gate conductor on said third gate oxide layer; and wherein said first gate conductor forms a part of a first transistor having a first operating voltage, said second gate conductor forms a part of a second transistor having a second operating voltage, said third gate conductor forms a part of a third transistor having a third operating voltage, and said first operating voltage is greater than said second operating voltage, and said second operating voltage is greater than said third operating voltage.

24. A method of fabricating gate oxide layers, comprising the steps of:

providing a silicon substrate having a first, second and third gate oxide regions;

forming a first gate oxide layer over said silicon substrate within said first gate oxide region; said first gate oxide layer having a first predetermined thickness from about 50 to 150 Å;

forming and planarizing a first layer of polysilicon over said first gate oxide layer;

etching said first planarized layer of polysilicon and said first gate oxide layer within said second gate oxide region exposing the silicon substrate within said second gate oxide region;

forming a second gate oxide layer over said exposed silicon substrate within said second gate oxide region by an anisotropic deposition;

forming a second layer of polysilicon over said second gate oxide layer;

planarizing said first and second layers of polysilicon to a uniform thickness;

etching said second planarized layer of polysilicon and said second gate oxide layer within said third gate oxide region exposing the silicon substrate within said third gate oxide region;

forming a third gate oxide layer over said exposed silicon substrate within said third gate oxide region by an anisotropic deposition;

forming a third layer of polysilicon over said third gate oxide layer; and planarizing said first, second and third layers of polysilicon to a uniform thickness.

* * * * *

UNITED STATES PATENT AND TRADEMARK OFFICE
CERTIFICATE OF CORRECTION

PATENT NO. : 6,268,251 B1
DATED : July 31, 2001
INVENTOR(S) : Dong Zhong, Jia Zhen Zheng It is certified that error appears in the above-identified patent and that said Letters Patent is hereby corrected as shown below:

<u>Title page,</u>
Item [74], delete "Stuffel" and replace with -- Stoffel --.

Signed and Sealed this

Twenty-sixth Day of March, 2002

*Attest:*

*Attesting Officer*

JAMES E. ROGAN
*Director of the United States Patent and Trademark Office*